(12) United States Patent
Ishikawa et al.

(10) Patent No.: US 6,198,376 B1
(45) Date of Patent: Mar. 6, 2001

(54) SAFETY DEVICE FOR ELECTRIC CIRCUIT

(75) Inventors: Satoshi Ishikawa; Osamu Soda, both of Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/397,673

(22) Filed: Sep. 16, 1999

(30) Foreign Application Priority Data

Sep. 21, 1998 (JP) .................................... 10-265935

(51) Int. Cl.[7] ........................ H01H 85/046; H01H 85/08; H01H 37/76
(52) U.S. Cl. ........................ 337/297; 337/404; 337/405; 337/416; 337/159
(58) Field of Search ........................ 337/297, 290, 337/295, 296, 159, 401, 402, 403–405, 416; 29/623

(56) References Cited

U.S. PATENT DOCUMENTS

| | | | |
|---|---|---|---|
| 3,334,205 | * 8/1967 | Griffin | 200/135 |
| 4,198,617 | * 4/1980 | Hara | 337/403 |
| 4,393,432 | * 7/1983 | Neuhaus et al. | 361/104 |
| 4,622,534 | * 11/1986 | Bowman | 337/404 |
| 4,652,848 | * 3/1987 | Hundrieser | 337/297 |
| 5,192,940 | * 3/1993 | Yajima et al. | 338/308 |
| 5,543,774 | * 8/1996 | Lof | 337/297 |
| 5,586,014 | * 12/1996 | Hasegawa | 361/534 |
| 5,631,621 | * 5/1997 | Nakajima | 337/280 |
| 5,708,553 | * 1/1998 | Hung | 361/103 |
| 5,777,540 | * 7/1998 | Dedert et al. | 337/142 |

FOREIGN PATENT DOCUMENTS

| | | | |
|---|---|---|---|
| 1-129744 | 9/1989 | (JP) . | |
| 3-263726 | * 11/1991 | (JP) | 337/414 |
| 4-56028 | 2/1992 | (JP) . | |
| 11-7876 | * 1/1999 | (JP) | H01H/37/76 |

* cited by examiner

*Primary Examiner*—Gregory Thompson
*Assistant Examiner*—Anatoly Vortman
(74) *Attorney, Agent, or Firm*—Armstrong, Westerman, Hattori, McLeland & Naughton, L.L.P.

(57) ABSTRACT

A safety device for preventing a trouble caused by an abnormal overheating of an electric circuit is provided, which includes: a circuit board; a first circuit pattern; a second circuit pattern; a first electrode connected to the first circuit pattern; a second electrode connected to the second circuit pattern, while enclosing the first electrode without a break, the second electrode being standoff-insulated from the first electrode; and a solder fuse portion made of a solder and formed over and inside the second electrode for bridging the first and second electrodes, wherein the solder fuse portion in a melted state separates onto the first and second electrodes by surface tension of the solder, whereby a circuit between the first and second circuit patterns is broken. Thus, a safety device for an electric circuit, which can be easily formed with the same and normal solder as used for connecting electrical parts, while having high reliability as a fuse and simultaneously being capable of reducing manufacturing cost, can be realized.

4 Claims, 4 Drawing Sheets

SAFETY DEVICE FOR ELECTRIC CIRCUIT

BACKGROUND OF THE INVENTION

1. Field of the Invention

The present invention generally relates to a safety device for preventing a trouble caused by an abnormal overheating of an electric circuit and more particularly, to a solder fuse, as a safety device, which can be easily formed with the same and normal solder as used for connecting electrical parts, has high reliability as a fuse, and can reduce manufacturing cost.

2. Description of the Related Art

For example, a voltage-dependent varistor is used as a conventional safety device for an electric circuit as proposed in Japanese U.M. Registration Application Laid-open No.1-129744.

In this safety device for an electric circuit, leads of the voltage-dependent varistor are bent in a right angle and are soldered to respective electrodes of first and second circuit patterns which are standoff-insulated each other on the circuit board, whereby the first and second circuit patterns are electrically connected.

In the above structure, the solder fixing the leads melts and then the voltage-dependent varistor falls due to its own weight when the ambient temperature of the first or second circuit pattern or of the voltage-dependent varistor has risen high, whereby the circuit between the first and second circuit patterns is broken. This prevents a trouble caused by an abnormal overheating of the electric circuit.

With respect to the above-described conventional safety device for an electric circuit, however, the voltage-dependent varistor is required and further the varistor requires to be held when the varistor is soldered to a circuit board, thereby consuming time and cost.

In order to solve this kind of problems, a number of safety devices for an electric circuit, in which a solder itself is used as a fuse, have been proposed.

Such a conventional safety device for an electric circuit is described with reference to FIGS. 3 and 4.

FIGS. 3A to 3C are plan views showing a conventional safety device for an electric circuit, which safety device utilizes a solder fuse. And, sectional views of FIGS. 3A to 3C are shown in FIGS. 4A to 4C, respectively.

As shown in FIGS. 3A and 4A, a first circuit pattern 110 and a second circuit pattern 120 are formed on a circuit board 100, and electrodes 111,121 of the respective first and second circuit patterns 110,120 are standoff-insulated each other by arranging a gap 100a therebetween. And, as shown in FIGS. 3B and 4B, a solder fuse portion 101 is formed with a solder 30 bridging the electrodes 111,121.

According to such a structure, when the ambient temperature of the first or second circuit pattern 110,120 or of the solder 30 has risen high, the solder 30 completely melts.

And then, as shown in FIGS. 3C and 4C, the melted solder 30 on the gap 100a is shed by the circuit board having no affinity with the solder 30 and separates on the electrodes 111,121 by surface tension.

Consequently, the circuit between the first and second circuit patterns 110,120 is broken, thereby preventing a trouble caused by an abnormal overheating of the electric circuit.

With respect to the above conventional solder fuse, however, when the solder fuse portion 101 is formed, the solder 30 shall be almost completely melted and is deposited over each of the electrodes 111,121.

When the solder fuse portion 101 is formed, however, since the solder 30 is apt to be separated on each of the electrodes 111,121, formation of the solder fuse portion 101 is difficult, thereby resulting in a low yield rate.

This is caused by form of the gap 100a between the electrodes 111,121, that is, since the gap 100a continues in an arrow direction shown in FIG. 3A, the melted solder 30 on the gap 100a is shed.

However, since the characteristics that the melted solder 30 is apt to be separated onto each of the electrodes 111,121 can be utilized as a fuse, it is necessary that the melted solder 30 does not separate onto the electrodes 111,121 only when the solder fuse portion 101 is formed.

In order to solve the above problem, Japanese Patent Application Laid-open No.4-56028 proposes a safety device for an electric circuit wherein a solder fuse portion is formed with a porous solder layer having cavities and bridging electrodes of respective first and second circuit patterns, which electrodes are standoff-insulated each other on a circuit board.

With respect to the above conventional safety device having such a structure, however, a solder shall be melted incompletely so as to form the porous solder layer, thereby consuming time and cost, compared with formation of a solder fuse portion with the normal solder 30.

SUMMARY OF THE INVENTION

In view of the foregoing, an object of the present invention is to provide a safety device for an electric circuit, wherein a solder fuse portion can be easily formed with the same and normal solder as used for connecting electrical parts, has high reliability as a fuse, and can reduce manufacturing cost.

In order to achieve the above-described object, as a first aspect of the present invention, a safety device for an electric circuit in accordance with the present invention includes: a circuit board; a first circuit pattern; a second circuit pattern; a first electrode connected to the first circuit pattern; a second electrode connected to the second circuit pattern, while enclosing the first electrode without a break, the second electrode being standoff-insulated from the first electrode; and a solder fuse portion made of a solder and formed over and inside the second electrode for bridging the first and second electrodes, wherein the solder fuse portion in a melted state separates onto the first and second electrodes by surface tension of the solder, whereby a circuit between the first and second circuit patterns is broken.

As a second aspect of the present invention, in the structure with the above first aspect, the first and second electrodes are arranged on the top of the circuit board and the first circuit pattern is arranged on the reverse side of the circuit board.

As a third aspect of the present invention, in the structure with the above first or second aspect, the first electrode is formed in a disk-shape and the second electrode is formed annularly.

According to the above-described structure, since the second electrode has no break, the second electrode can prevent the almost completely melted solder from spreading outward and simultaneously can leave the almost completely melted solder on the gap arranged on the top of the circuit board. That is, the solder fuse portion can be easily formed with the same and normal solder as used for connecting electrical parts.

Also, since the completely melted solder surely separates onto each of the first and second electrodes at an abnormal overheating of the electric circuit, the circuit between the first and second circuit patterns is broken, thereby achieving high reliability as a fuse.

Further, since the solder fuse portion can be formed with the same and normal solder as used for connecting electrical parts, a special manufacturing process conventionally required is not required, whereby the safety device for an electric circuit can be manufactured at low cost.

As described hereinabove, according to the safety device for an electric circuit in accordance with the present invention, a solder fuse portion can be easily formed with the same and normal solder as used for connecting electrical parts, has high reliability as a fuse, and can reduce manufacturing cost.

The above and other objects and features of the present invention will become more apparent from the following description taken in conjunction with the accompanying drawings.

DESCRIPTION OF THE PREFERRED EMBODIMENT

An embodiment of the present invention will now be described in further detail with reference to the accompanying drawings.

Figure 1A:
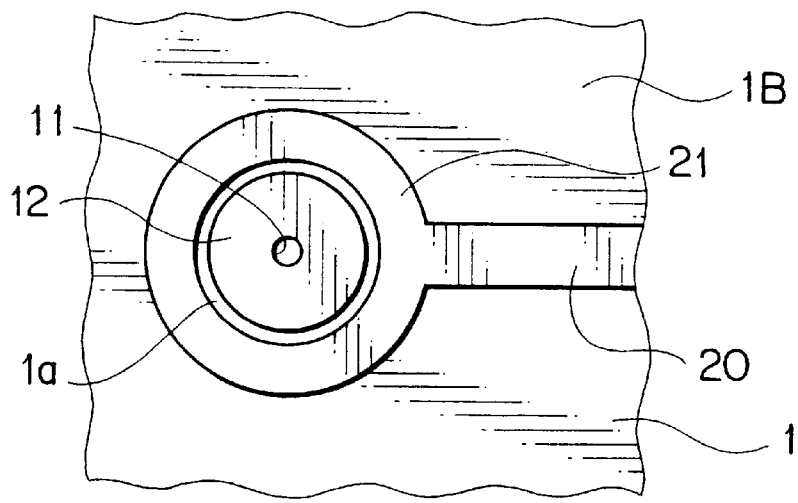
FIG. 1A is a plan view showing an embodiment of a safety device for an electric circuit in accordance with the present invention, in which a solder fuse portion is not formed yet.
Figure 1B:
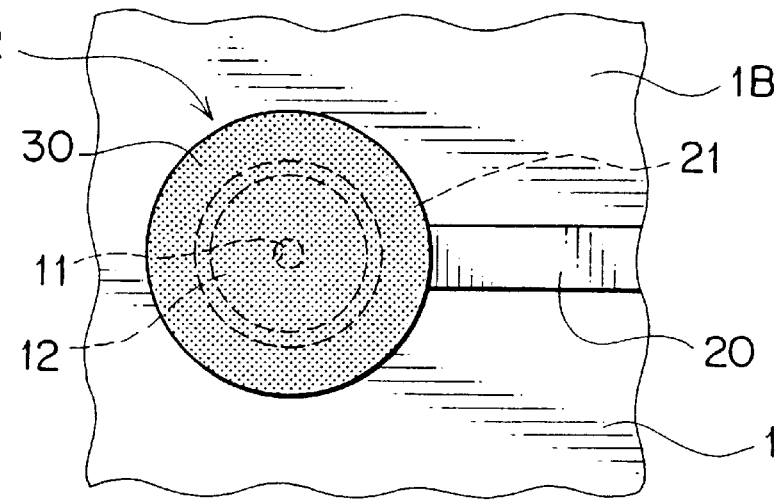
FIG. 1B is a plan view of the safety device of FIG. 1A, in which a solder fuse portion has been formed.
Figure 1C:
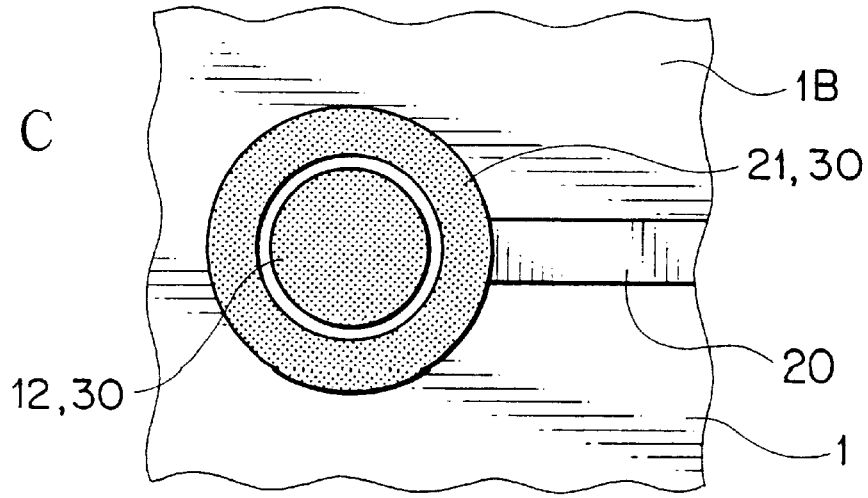
FIG. 1C is a plan view of the safety device of FIG. 1B, in which the solder fuse portion has melted due to an abnormal overheating.

FIGS. 1A to 1C are plan views showing an embodiment of a safety device for an electric circuit in accordance with the present invention. And, FIGS. 2A to 2C are sectional views of FIGS. 1A to 1C, respectively.

Figure 2A:
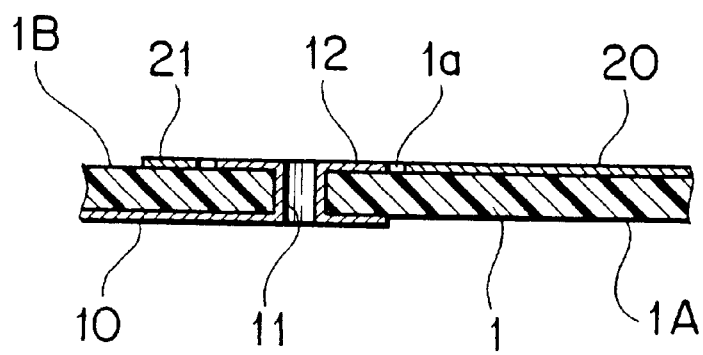
FIGS. 2A, 2B, and 2C are sectional views of FIGS. 1A, 1B, and 1C, respectively.
Figure 2B:
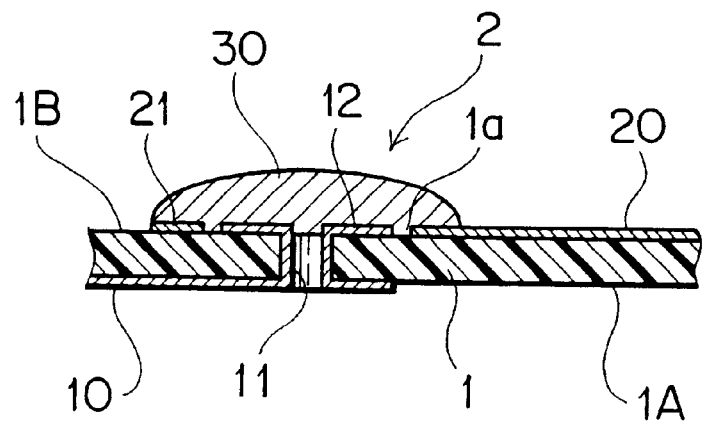
Figure 2C:
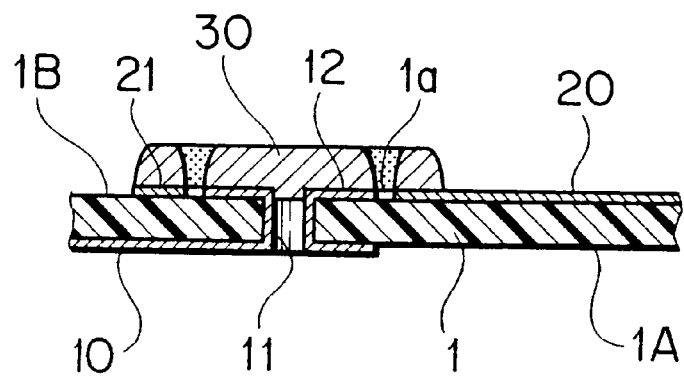
Figure 3A:
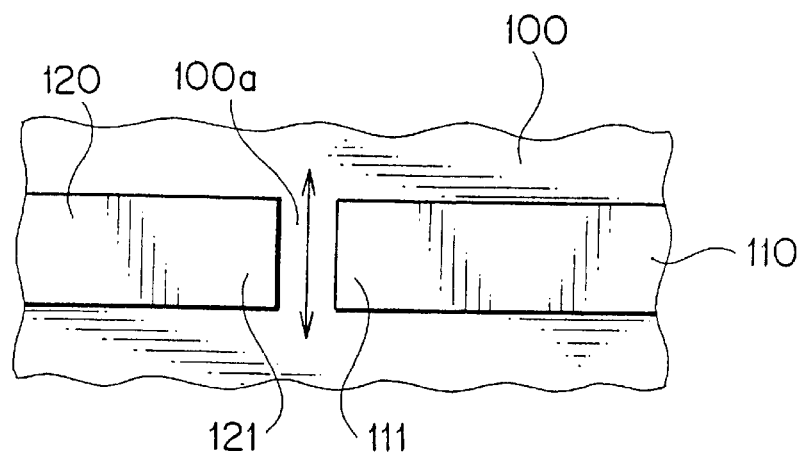
FIG. 3A is a plan view showing a conventional safety device for an electric circuit, in which a solder fuse portion is not formed yet.
Figure 3B:
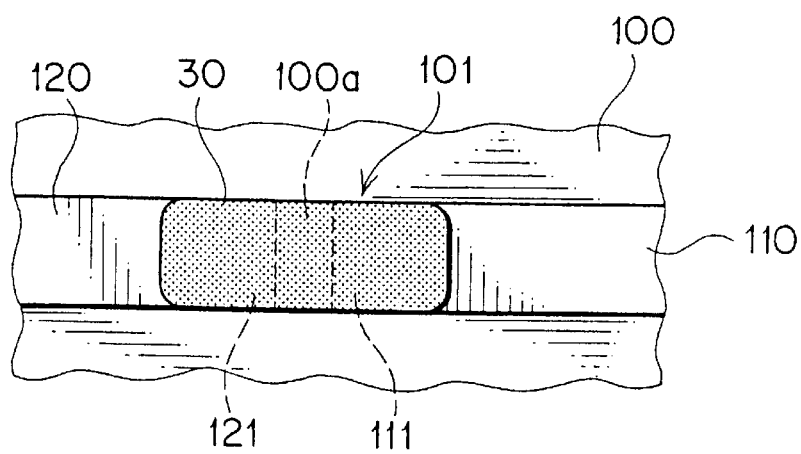
FIG. 3B is a plan view of the conventional safety device of FIG. 3A, in which a solder fuse portion has been formed.
Figure 3C:
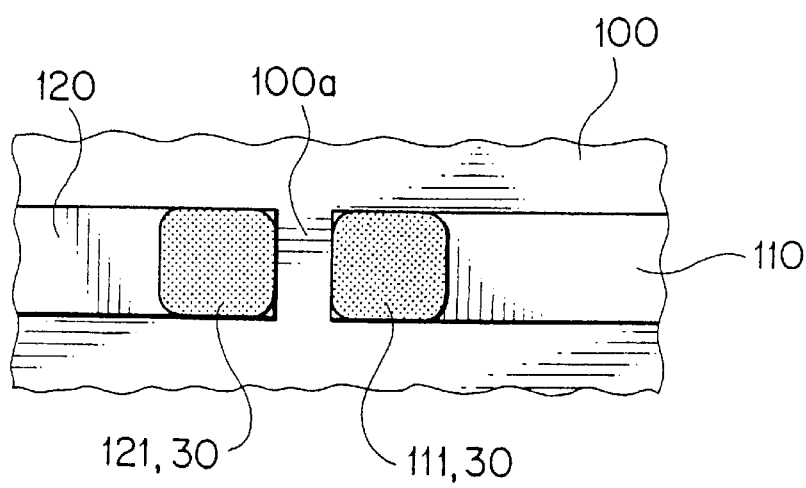
FIG. 3C is a plan view of the conventional safety device of FIG. 3B, in which the solder fuse portion has melted due to an abnormal overheating.
Figure 4A:
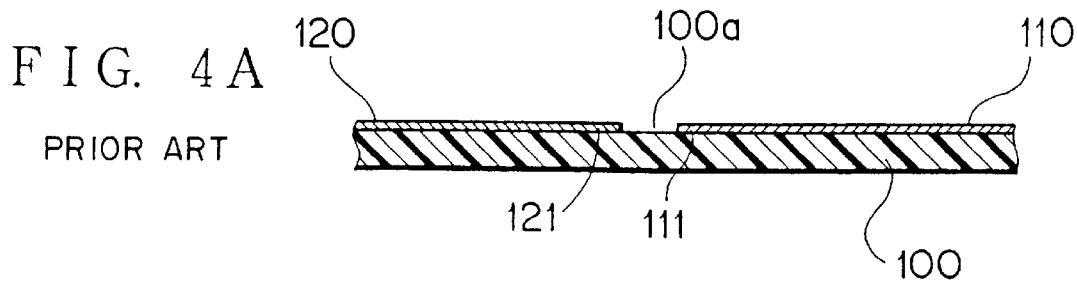
FIGS. 4A, 4B, and 4C are sectional views of FIGS. 3A, 3B, and 3C, respectively.
Figure 4B:
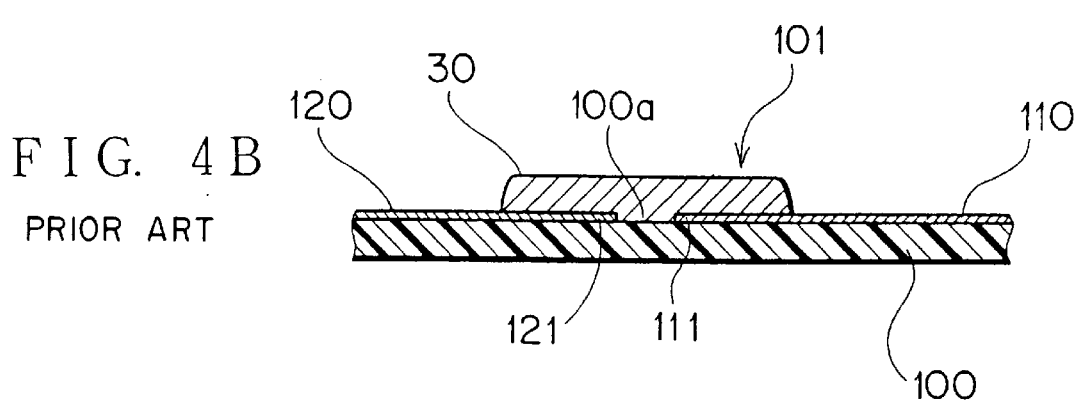
Figure 4C:
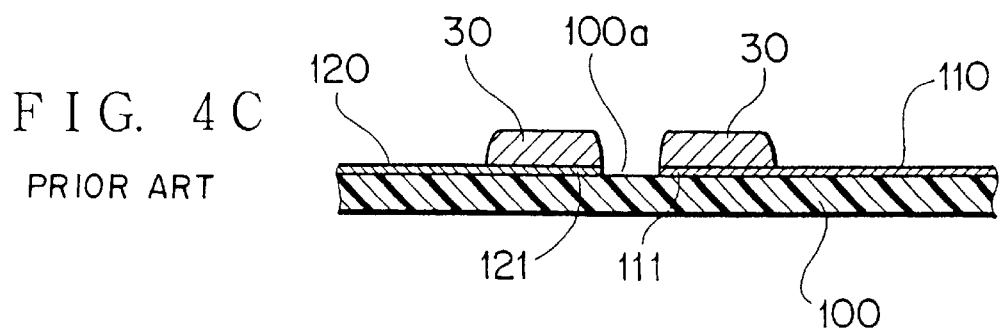

Referring to FIGS. 1A and 2A, a first circuit pattern 10 is formed on the reverse 1A of a circuit board 1.

On the other hand, a circular first electrode 12 continuing from a first circuit pattern 10 through a through hole 11 is formed on the top 1B of the circuit board 1.

And, a second electrode 21 standoff-insulated from the first electrode 12 by means of a gap 1a is formed outside the first electrode 12 arranged on the top 1B of the circuit board 1.

The second electrode 21 has an annular pattern concentric with the first electrode 12, that is, the second electrode 21 encloses the first electrode 12 without a break.

The second electrode 21 continues from the second circuit pattern 20.

And, as shown in FIGS. 1B and 2B, a solder fuse portion 2 bridging the first and second electrodes 12,21 is formed by depositing the almost completely melted solder 30 over and inside the second electrode 21.

An action of the solder fuse portion 2 is described hereinafter.

The solder 30 completely melts when the ambient temperature of the first or second circuit pattern or of the solder 30 has risen high.

And then, as shown in FIGS. 1C and 2C, the melted solder 30 on the gap 1a is shed by the circuit board having no affinity with the solder 30 and separates on the electrodes 12,21 by surface tension.

Consequently, the circuit between the first and second circuit patterns 10,20 is broken, thereby preventing a trouble caused by an abnormal overheating of the electric circuit.

According to the safety device for an electric circuit in accordance with the present invention, since the second electrode 21 has no break, the second electrode 21 can prevent the almost completely melted solder 30 from spreading outward and simultaneously can leave the almost completely melted solder 30 on the gap 1a arranged on the top of the circuit board. That is, the solder fuse portion 2 can be easily formed with the same and normal solder 30 as used for connecting electrical parts.

Also, since the completely melted solder 30 surely separates onto each of the first and second electrodes 12,21 at an abnormal overheating of the electric circuit, the circuit between the first and second circuit patterns 10,20 is broken, thereby achieving high reliability as a fuse.

Further, since the solder fuse portion 2 can be formed with the same and normal solder 30 as used for connecting electrical parts, a special manufacturing process conventionally required is not required, whereby the safety device for an electric circuit can be manufactured at low cost.

A safety device for an electric circuit in accordance with the present invention is, however, not limited to the above-described embodiment.

For example, though the solder fuse portion 2 in the embodiment is formed by bridging the two circuit patterns, i.e., the first circuit pattern 10 and the second circuit pattern 20, with use of the solder 30, a plurality of circuit patterns can be bridged.

Also, the second electrode 21 is not limited to an annular shape shown in FIG. 1A, that is, a second electrode in a rectangular, oval, or other shape which can enclose the first electrode 12 without a break is available.

Further, the first electrode 12, the second electrode 21, and the second circuit pattern 20 may be formed on the reverse 1A of the circuit board 1 and therefore the first circuit pattern 10 may be formed on the top 1B of the circuit board 1.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A safety device for an electric circuit, comprising:
   a circuit board;
   a first circuit pattern;
   a second circuit pattern;
   a first electrode connected to said first circuit pattern;

a second electrode connected to said second circuit pattern, while enclosing said first electrode without a break, said second electrode being standoff-insulated from said first electrode; and a solder fuse portion made of a solder and formed over and inside said second electrode for bridging said first and second electrodes, wherein said solder fuse portion in a melted state separates onto said first and second electrodes by surface tension of said solder, whereby a circuit between said first and second circuit patterns is broken.

2. The safety device according to claim 1, wherein
said first and second electrodes are arranged on the top of said circuit board and
said first circuit pattern is arranged on the reverse side of said circuit board.

3. The safety device according to claim 1, wherein
said first electrode is formed in a disk-shape and
said second electrode is formed annularly.

4. The safety device according to claim 2, wherein
said first electrode is formed in a disk-like shape and
said second electrode is formed annularly.

* * * * *